(12) United States Patent　(10) Patent No.: US 6,793,388 B2
Matsumoto　(45) Date of Patent: Sep. 21, 2004

(54) SEMICONDUCTOR LASER AND FABRICATING METHOD OF THE SAME

(75) Inventor: Kenji Matsumoto, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 108 days.

(21) Appl. No.: 09/873,218

(22) Filed: Jun. 5, 2001

(65) Prior Publication Data

US 2001/0053166 A1 Dec. 20, 2001

(30) Foreign Application Priority Data

Jun. 5, 2001　(JP) ...................................... 2000-167710

(51) Int. Cl.[7] ............................................... H01S 5/00
(52) U.S. Cl. ........................................ 374/43; 372/46
(58) Field of Search .............................. 372/43, 45, 46, 372/50, 75, 54, 44; 257/99; 148/DIG. 95; 438/22, 41, 40, 42; 385/131

(56) References Cited

U.S. PATENT DOCUMENTS

| | | | |
|---|---|---|---|
| 4,737,961 A | * | 4/1988 | Mori et al. .................... 372/46 |
| 5,585,309 A | * | 12/1996 | Mori et al. .......... 148/DIG. 95 |
| 5,696,389 A | * | 12/1997 | Ishikawa et al. .............. 257/99 |
| 6,323,052 B1 | * | 11/2001 | Horie et al. ................... 438/22 |

OTHER PUBLICATIONS

H. Yang, M. Nesnidal, A. Al–Muhanna, L.J. Mawst, Senior Member, IEEE, D. Botez, Fellow, IEEE, T.A. Vang, F.D. Alvarez, and R. Johnson, High–Power Single–Mode Simplified Antiresonan Reflecting Optical Waveguide (S–Arrow) Distributed Feedback Semiconductor Lasers, IEEE Photonics Teechnology Letters, vol. 10, No. 8, Aug. 1998, p. 1079, 1080 and 1081.

* cited by examiner

*Primary Examiner*—Don Wong
*Assistant Examiner*—Tuan N. Nguyen
(74) *Attorney, Agent, or Firm*—Sughrue Mion, PLLC (57) ABSTRACT

A semiconductor laser having an S-ARROW structure confining a basic lateral mode light between a pair of guide layers extending with a gap therebetween, which increases a precision of a shape of a guide portion, and is capable of stably emitting a light in the basic lateral mode. In the semiconductor laser having an activation layer and a plurality of layers in parallel with the activation layer, a first groove penetrating through at least some of the layers is formed, and a pair of second grooves extending to predetermined positions toward both sides from the first groove are formed in a specified layer among the layers through which the first groove penetrates. Furthermore, a material having a refractive index higher than that of the specified layer is filled up in the second grooves, thus forming two portions having a high refractive index.

5 Claims, 10 Drawing Sheets

EQUIVALENT REFRACTIVE INDEX

EQUIVALENT REFRACTIVE INDEX

FIG. 18A

PRIOR ART

FIG. 18B

PRIOR ART

FIG. 19

PRIOR ART

FIG. 20

PRIOR ART

FIG. 21

PRIOR ART

FIG. 22

PRIOR ART

SEMICONDUCTOR LASER AND FABRICATING METHOD OF THE SAME

BACKGROUND OF THE INVENTION

1. Field of the Invention

The present invention relates to a semiconductor laser, and more particularly to a semiconductor laser having a so-called simplified antiresonant reflecting optical waveguide (hereinafter referred to as S-ARROW) structure, which is constructed so as to confine a basic lateral mode light between a pair of high refractive index layers, each extending with a gap therebetween.

The present invention relates also to a method of fabricating a semiconductor laser having the S-ARROW structure.

2. Description of Related Arts

A semiconductor laser has been predominantly used as a light source for use in optical communication, a light source for use in an optical disc and the like by use of property that a laser light emitted therefrom can be collected up to a diffraction limitation. However, all light radiated from the semiconductor laser can never be collected up to the diffraction limitations thereof. Only light having well matched phases is collected at a light emission end of the semiconductor laser. The semiconductor laser in a condition of being capable of emitting such a light is known as one performing light emission in a basic lateral mode. Under condition that light of various phase is being emitted mixedly, in other words, under condition that high ordered lateral mode light is being mixedly emitted, the light cannot be collected up to a diffraction limitation.

It has been widely known that the foregoing basic lateral mode operation is more stable as an area of a light emission section is made smaller so that it is difficult for the high order lateral mode light to be mixedly present. For this reason, a size of a waveguide path in the semiconductor laser is set to 1 $\mu$m or less in a direction of a thickness thereof, and to about 2 to about 4 $\mu$m in a direction in parallel with a light emission layer thereof. It has been well known by experience that a semiconductor laser device emitting a light in a basic lateral mode more stably can be manufactured with a high yield as a width of the waveguide path in the direction in parallel with the light emission layer is made narrower.

However, if the area of the light emission section is made small by narrowing the lateral width of the waveguide path, an increase in light density in a light emission end of the semiconductor laser is inevitably brought about. The increase in the light density in the light emission end incurs deterioration of materials constituting the semiconductor laser, resulting in reduction in the life of the device.

In other words, the stabilization of the basic lateral mode (the small section area of the waveguide path) and an increase in light output (the large section area of the waveguide path) are mutually incompatible. Accordingly, to overcome this limitation is an important problem in researching and developing existing semiconductor lasers.

As disclosed in IEEE PHOTONICS TECHNOLOGY LETTERS, Vol. 10, No. 8, August 1998, the S-ARROW structure has been proposed as one idea to solve the problem. The S-ARROW structure has a light emission width of about 6 $\mu$m, and the width of the light emission section of this structure can be set to be 1.5 to 2 times as large as that of the conventional structure, so that it is anticipated that the maximum light output will be improved.

The reason why the semiconductor laser adopting the S-ARROW structure emits light in the basic lateral mode will be explained below.

Figure 18A:
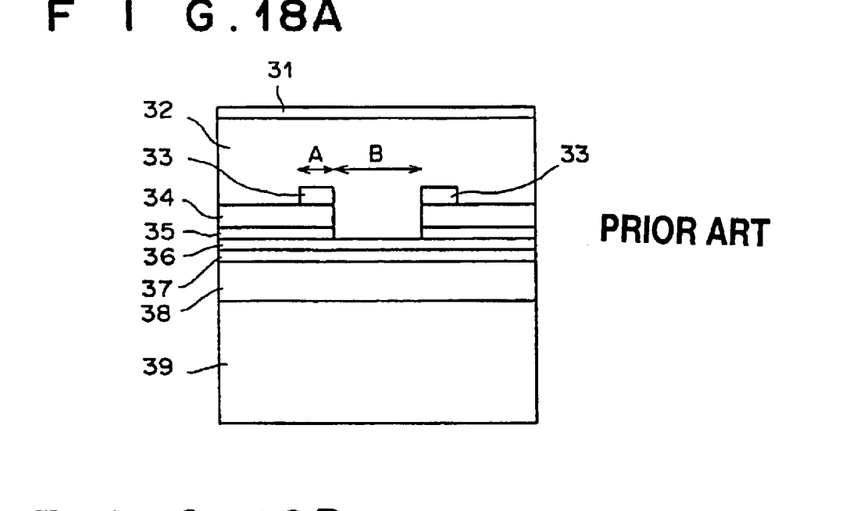
FIGS. 18A and 18B are schematic sectional views showing a conventional semiconductor laser having an S-ARROW structure and an equivalent refractive index distribution thereof.

A cross section of the principal portion of the semiconductor laser having the S-ARROW structure, that is, a shape in a cross section perpendicular to the waveguide direction, is shown in FIG. 18A. This semiconductor laser comprises an n-GaAs substrate 39; a lower clad layer 38 made of n-InGaP, formed on the n-GaAs substrate 39; a SCH (separate-cofinement-heterostructure) structural layer 37 made of InGaAsP, which includes an InGaAs quantum well activation layer; upper clad layers 36 and 32 made of p-InGaP; an etching stop layer 35 made of n-GaAs; a current blocking layer 34 made of n-AlInP; guide portions 33 of a thickness of e.g. 0.25 $\mu$m, made of n-GaAs; and a contact layer 31 made of p-GaAs.

Figure 18B:
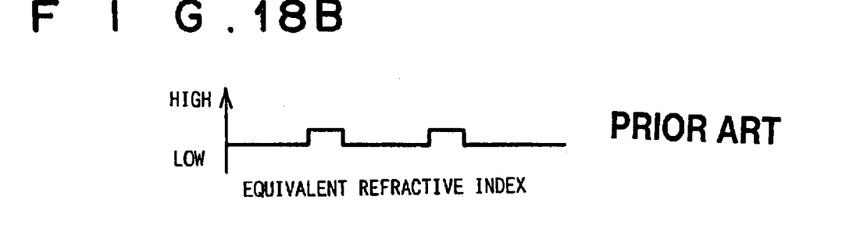

In the above-described structure, since GaAs constituting the above-described guide portion 33 possesses a refractive index higher than that of a periphery of the guide portions 33, an equivalent refractive index in a direction in parallel with the SCH structural layer 37 has a distribution high in the guide portion 33 and low in other portions, as shown in FIG. 18B.

In such a waveguide structure, with respect to the width A of each of the two guide portions 33, a dimension is selected so that while only light in a basic lateral mode is confined between these guide portions 33, light in a high ordered lateral mode is not confined therebetween but escapes outside each of the guide portions 33. According to the literature cited above, the width A of the guide portions 33 is set to 0.85 $\mu$m, and the width B of the groove formed by the guide portions 33 is set to 6.5 $\mu$m.

Due to the effect of the current blocking layer 34, a current producing a gain of the laser is injected only between the two guide portions 33, and the gain relevant to the laser light is generated only between the guide portions 33.

Accordingly, only the light in the basic lateral mode is confined between the guide portions 33, and hence a sufficient gain can be obtained. On the other hand, since the light in the high order lateral mode is not confined between the guide portions 33, a gain cannot be obtained. As a natural consequence of such a fact, the light in the basic lateral mode is given priority in emission, and the semiconductor laser operates in a stable basic lateral mode until the high light output.

Heretofore, however, the fabrication of the semiconductor laser having the S-ARROW structure has inevitably shown a low yield for the following reason, causing a serious problem in mass production of the semiconductor lasers. To explain this reason, a method of fabricating the semiconductor laser having the S-ARROW structure will first be described with reference to FIGS. 19 to 22.

Figure 19:
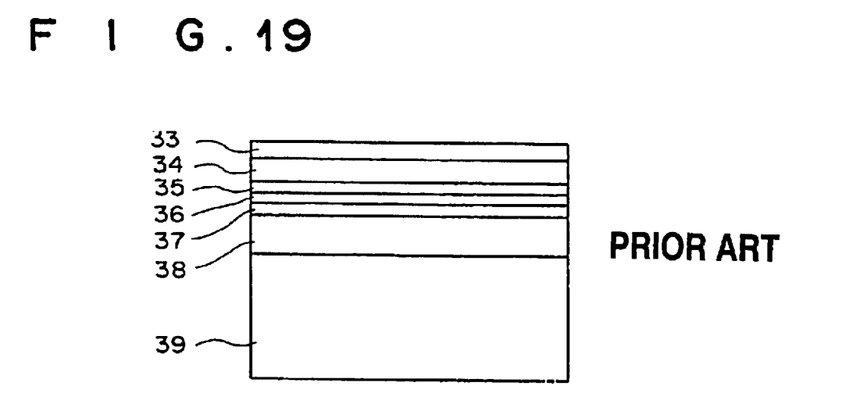
FIG. 19 is a drawing showing a manufacturing step of the semiconductor laser of FIGS. 18A and 18B.

As shown in FIG. 19, on the n-GaAs substrate 39, there are sequentially grown the lower clad layer 38 made of n-InGaP, the SCH (Separate-confinement-heterostructure) structural layer 37 made of InGaAsP, which includes the InGaAs quantum well activation layer, the upper clad layer 36 made of p-InGaP, the etching stop layer 35 made of n-GaAs, the current blocking layer 34 made of n-AlInP, and the guide portion 33 having a thickness of 0.25 $\mu$m, which is made of n-GaAs by use of an organometallic growth method.

Figure 20:
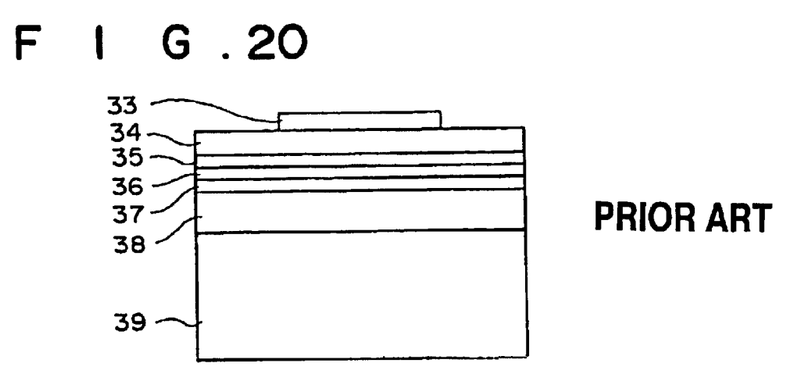
FIG. 20 is a drawing showing a manufacturing step of the semiconductor laser of FIGS. 18A and 18B.

The GaAs layer is partially removed by a photolithography step and an etching step while leaving the part of the GaAs layer functioning as the guide portion 33, thus obtaining the sectional structure shown in FIG. 20.

Figure 21:
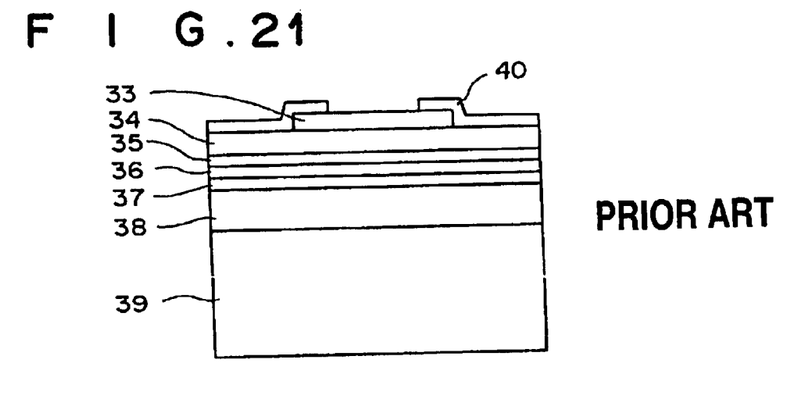
FIG. 21 is a drawing showing a manufacturing step of the semiconductor laser of FIGS. 18A and 18B.
Figure 22:
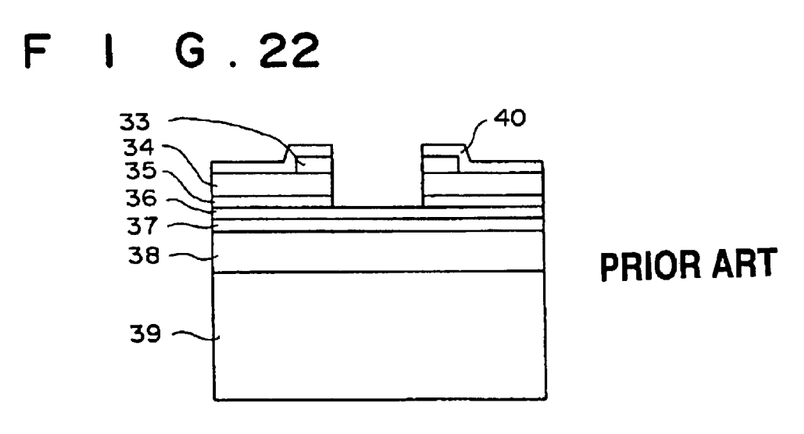
FIG. 22 is a drawing showing a manufacturing step of the semiconductor laser of FIGS. 18A and 18B.

Furthermore, as shown in FIG. 21, a resist pattern 40 is formed at portions other than that corresponding to a groove having the width B (see FIG. 18) by use of a photolithography step.

Thereafter, by use of the resist pattern 40 as a mask, the semiconductor layers including the guide portion 33, the current blocking layer 34 and the etching stop layer 35 are sequentially etched so as to be removed until the upper clad layer 36 made of p-InGaP is exposed. Thus, the sectional structure shown in FIG. 22, in which a pair of resist patterns 40 are formed, is obtained.

Thereafter, the resist pattern 40 is removed, and then the upper clad layer 32 made of p-InGaP and the contact layer 31 made of p-GaAs are formed by a crystal growth method, thus obtaining the semiconductor laser having the structure shown in FIG. 18.

In the conventional method described above, the photolithography steps were performed two times. The pair of resist patterns 40 had a size of about 01 $\mu$m and were required to be coincident with each other with a very high precision. If this precision is low, the widths of the guide portions 33 differ from each other, and the guide portions 33 cannot have an original width. Moreover, formation positions of the guide portions 33 deviate from the predetermined positions.

In the semiconductor laser fabricated in such a manner, since light other than that in the basic lateral mode remains between the guide portions 33, the semiconductor laser emits light in a mode other than the basic lateral mode. Furthermore, the light in the basic lateral mode is not sufficiently guided between the guide portions, resulting in a drawback that a threshold value of oscillation current in the basic lateral mode increases. To be concrete, even when the positions and widths of the guide portions 33 deviate from predetermined values by about 0.1 to 0.2 $\mu$m, deterioration in electric characteristics of the semiconductor laser is brought about.

SUMMARY OF THE INVENTION

The present invention was conceived in view of the foregoing circumstances, and the object is to provide a semiconductor laser having a S-ARROW structure, which has a high precision in shapes of a pair of highly refractive guide portions, thus emitting light in a basic lateral mode stably, and is capable of keeping a threshold value of oscillation current in the basic lateral mode low.

Another object of the present invention is to provide a method of fabricating such a semiconductor laser.

A method of fabricating a semiconductor laser according to the present invention having a structure in which an equivalent refractive index of two portions disposed apart from each other is higher than that of adjacent portions to these portions on a plane perpendicular to a waveguide direction as well as in a direction in parallel with an activation layer, comprises the steps of:

forming the activation layer and a plurality of layers in parallel with the activation layer;

forming a first groove penetrating through at least some of the plurality of layers;

selectively etching a specified layer among the layers through which the first groove penetrates, to a predetermined position toward both sides from the first groove, thus forming a pair of second grooves; and filling up the second grooves with a material having a refractive index higher than at of the specified layer, thus forming two portions having the high equivalent refractive index.

A first semiconductor laser of the present invention fabricated according to the method, which has a structure in which an equivalent refractive index of two portions disposed apart from each other is higher than that of adjacent portions to these portions in a direction perpendicular to a waveguide direction as well as in parallel with an activation layer, comprises:

the activation layer and a plurality of layers in parallel with the activation layer, wherein a first groove is formed penetrating through at least some of the plurality of layers;

a pair of second grooves extending from the first groove to predetermined positions toward both sides are formed in a specified layer among the layers through which the first groove penetrates;

the second grooves are filled up with a material having a refractive index higher than that of the specified layer, and thus two portions having the high equivalent refractive index are formed; and another layer is formed in a state where the two portions contact with the material having the higher refractive index left on a surface portion of the first groove.

A second semiconductor laser of the present invention fabricated according to the method, which has a structure in which an equivalent refractive index of two portions disposed apart from each other is higher than that of adjacent portions to these portions in a direction perpendicular to a waveguide direction as well in parallel with an activation layer, comprises:

the activation layer and a plurality of layers in parallel with the activation layer, wherein a first groove is formed penetrating through at least some of the plurality of layers;

a pair of second grooves extending from the first groove to predetermined positions toward both sides are formed in a specified layer among the layers through which the first groove penetrates;

the second grooves are filled up with a material having a refractive index higher than that of the specified layer, and thus two portions having the high equivalent refractive index are formed; and another layer made of a different material from the high refractive material is formed in a state where the two portions contact with a surface portion of the first groove.

A third semiconductor laser of the present invention fabricated according to the method, which has a structure in which an equivalent refractive index of two portions disposed apart from each other is higher than that of adjacent portions to these portions in a direction perpendicular to a waveguide direction as well as in parallel with an activation layer, comprises:

the activation layer and a plurality of layers in parallel with the activation layer, wherein a first groove is formed penetrating through at least some of the plurality of the layers;

a pair of second grooves extending from the first groove to predetermined positions toward both sides are formed in a specified layer among the layers through which the first groove penetrates;

the second grooves are filled up with a material having a refractive index higher than that of the specified layer; and layers made of a material having a low refractive index are laminated on the material exposed in the first groove, this refractive index being lower than that of the exposed material, and thus two portions having the high equivalent refractive index are formed outside the material having the low refractive index.

Note that in the third semiconductor laser, the material having the high refractive index and the material having the low refractive index may be two separate materials, each having a constant refractive index, or alternatively one refractive index distribution material in which a refractive index gradually varies in a lamination direction of both materials.

In the method of fabricating each of the semiconductor lasers according to the present invention, the first groove penetrating the layers in parallel with the activation layer is first formed, and then the pair of second grooves are formed by selectively etching the specified layer among the layers through which the first groove penetrates from the first groove to the predetermined positions toward both sides from the first groove. Accordingly, the pair of second grooves are formed at etching rates naturally equal to each other, so depths from the first groove become equal to each other. Thus, widths of the materials having the high refractive index filled up in the pair of the second grooves, that is, widths of guide portions, are formed equal to each other in a self-alignment manner with a high precision.

Accordingly, the semiconductor laser fabricated according to the method of the present invention has the pair of the guide portions made of the high refractive index material, which are formed to shapes with a high precision, and can emit light in a basic lateral mode stably, thus keeping a threshold value of oscillation current in a basic lateral mode low.

DETAILED DESCRIPTION OF THE PREFERRED EMBODIMENTS

Figure 1A:
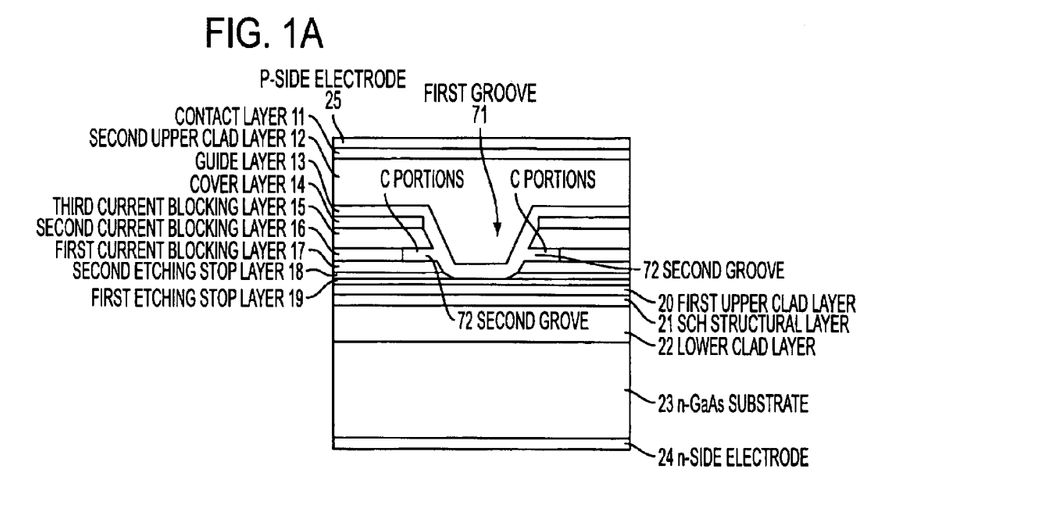
FIGS. 1A and 1B are schematic sectional views showing a semiconductor laser according to a first embodiment and an equivalent refractive index distribution thereof.
Figure 1B:
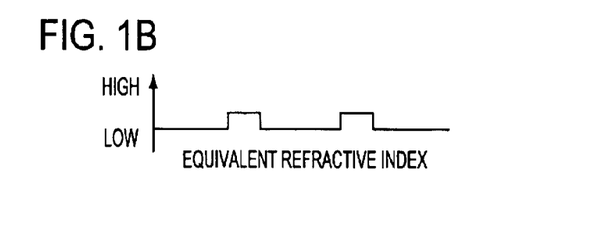

Embodiments of the present invention will be described below with reference to the accompanying drawings. FIGS. 1A and 1B show a shape in a section perpendicular to a waveguide direction of a semiconductor laser according to a first embodiment of the present invention and an equivalent refractive index distribution thereof. FIGS. 2 to 5 and FIGS. 6A and 6B show sequential steps for fabricating the semiconductor laser.

The semiconductor laser as shown in FIG. 1A comprises an n-GaAs substrate 23; a lower clad layer 22 made of n-InGaP; a SCH structural layer 21 made of InGaAsP including an InGaAs quantum well activation layer; a first upper clad layer 20 made of p-InGaP; a first etching stop layer 19 made of p-GaAs; a second etching stop layer 18 made of n-InGaP; a first current blocking layer 17 made of n-GaAs; a second current blocking layer 16 made of n-InGaAsP; a third current blocking layer 15 made of n-AlGaAs; a cover layer 14 made of n-GaAs; a guide layer 13 made of p-GaAs; a second upper clad layer 12 made of p-AlGaAs; and a contact layer 11 made of p-GaAs. Furthermore, an n-side electrode 24 is formed on the rear surface of the n-GaAs substrate 23, and a p-side electrode 25 is formed over the contact layer 11.

Here, semiconductors constituting the second current blocking layer 16 and the third current blocking layer 15 have a composition having a refractive index lower than that of GaAs. In this structure of the semiconductor laser, the layers made of GaAs having a high refractive index above the first upper clad layer 20 determines a refractive index distribution in a horizontal direction, that is, in a direction in parallel with the SCH structural layer 21. Note that since the GaAs layers disposed above the third current blocking layer 15 are distant from a light emission portion, these GaAs layers have less effect on the refractive index distribution. Accordingly, an equivalent refractive index distribution is equal to the refractive index distribution of GaAs constituting the first current blocking layer 17 and the guide layer 13 shown by slanted lines in FIG. 6A. As a matter of course, the portion C having the thick GaAs layer has a refractive index higher than those of other portions. This structure of the semiconductor laser has an equivalent refractive index distribution shown in FIG. 1B when viewed in the horizontal direction, and it is understood that this structure thereof is identical to a waveguide structure of the foregoing S-ARROW structure.

Next, a method of fabricating the semiconductor laser will be described with reference to FIG. 2 to FIGS. 6A and 6B.

Figure 2:
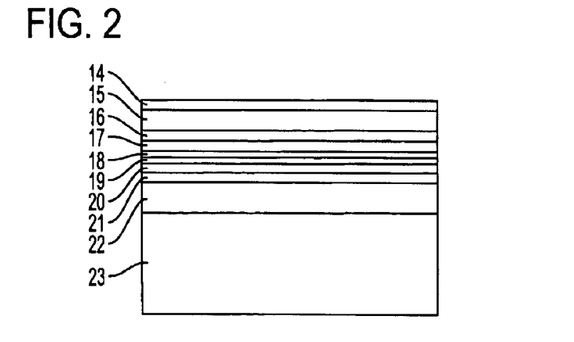
FIG. 2 is a drawing showing a manufacturing step of the semiconductor laser of FIGS. 1A and 1B.

As shown in FIG. 2, by use of an organometallic growth method, on the n-GaAs substrate 23, there is sequential formation of the lower clad layer 22 made of n-InGaP; the SCH structural layer 21 made of InGaAsP including the InGaAs quantum well activation layer; the first upper clad layer 20 made of p-InGaP; the first etching stop layer 19 made of p-GaAs; the second etching stop layer 18 made of n-InGaP; the first current blocking layer 17 made of n-GaAs; a second current blocking layer 16 made of n-InGaAsP; a third current blocking layer 15 made of n-AlGaAs; and a cover layer 14 made of n-GaAs.

Figure 3:
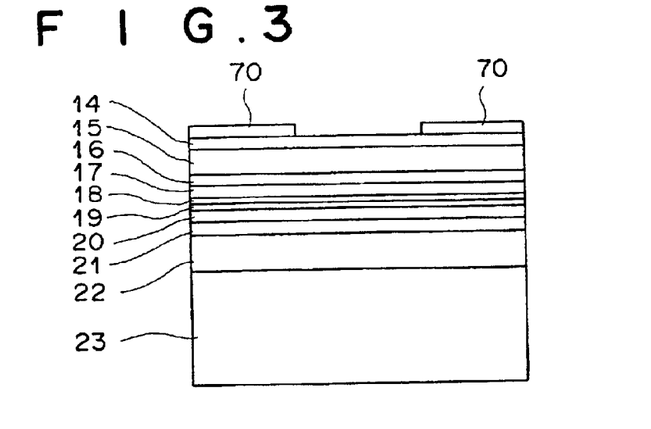
FIG. 3 is a drawing showing a manufacturing step of the semiconductor laser of FIGS. 1A and 1B.
Figure 4:
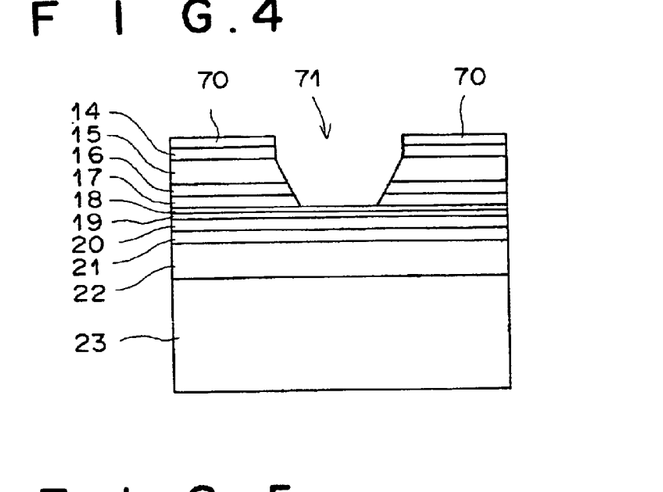
FIG. 4 is a drawing showing a manufacturing step of the semiconductor laser of FIGS. 1A and 1B.

Subsequently, as shown in FIG. 3, a resist pattern 70 is formed on parts of the cover layer 14 other than a groove portion by a photolithography step. Furthermore, as shown in FIG. 4, the cover layer 14, the third current blocking layer 15, the second current blocking layer 16, the first current blocking layer 17 and the second etching stop layer 18 are etched and removed by a chemical etching method. Thus, a first groove 71 extending to a direction intersecting the surface of the substrate 23 is formed.

Figure 5:
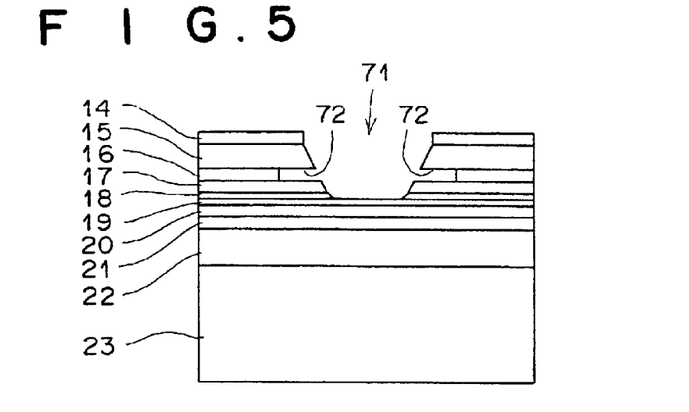
FIG. 5 is a drawing showing a manufacturing step of the semiconductor laser of FIGS. 1A and 1B.

Next, the multi-layered semiconductor film is dipped in an etching solution of tartaric acid series offering a fast etching rate only for InGaAsP, and the current blocking layer 16 is etched to predetermined positions from the first groove 71 toward both left and right directions. Furthermore, the resist pattern 70 is also removed. Thus, the sectional structure as shown in FIG. 5 is obtained. Here, a groove extending toward a direction in parallel with the SCH structure layer 21, the groove being obtained by removing the current blocking layer 16 in the above-described manner, shall be referred to as a second groove 72.

Figure 6A:
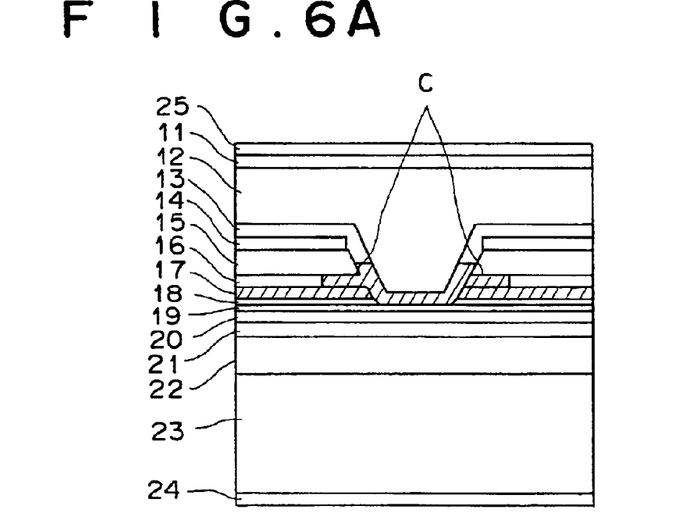
FIGS. 6A and 6B are drawings showing a manufacturing step of the semiconductor laser of FIGS. 1A and 1B.
Figure 6B:
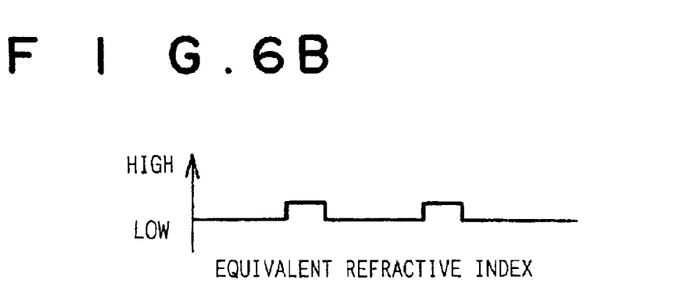

Furthermore, as shown in FIG. 6A, the guide layer 13 made of p-GaAs, the second upper clad layer 12 made of p-AlGaAs and the contact layer 11 made of p-GaAs are formed by crystal growth. At this time, since growth material gas easily enters into the narrow second groove 72 corresponding to the guide portion C by use of a vapor deposition method, the second groove 72 can be filled up with the guide layer 13.

Thereafter, the p-side electrode 25 is formed over the contact layer 11. The substrate 23 is polished, and then the n-side electrode 24 is formed. Furthermore, a high-reflectance coat and a low-reflectance coat are formed on a resonator plane obtained by cleaving a sample. Thereafter, when the resultant structure is processed to a chip, the semiconductor laser device shown in FIG. 1 is obtained.

This semiconductor laser device is mounted onto a heat sink in a junction down manner with electrically conductive solder material such as In, and the semiconductor laser device undergoes wire-bonding for the n-side electrode 24, thus completing the semiconductor laser apparatus.

In this embodiment, since the second grooves 72 are formed by etching the portions of the current blocking layer 16 extending from the first groove 71 to predetermined positions toward left and right directions thereof, the right and left second grooves 72 extend to the positions distant from the first groove 71 by equal distances. Accordingly, the widths of the portions of the guide layers 13 filled in the right and left second grooves 72 are equal to each other with a high precision in a self-alignment manner. Thus, the semiconductor laser having the S-ARROW structure emits light in the basic lateral mode stably, and can keep a threshold value of oscillation current in the basic lateral mode low.

To be concrete, the semiconductor laser device having the above-described constitution oscillates with a resonator length of 1.5 mm and an oscillation wavelength of 980 nm, and operates up to an output of 0.5 W on a light output vs. current characteristic without any trouble. Furthermore, the semiconductor laser device can obtain a stable light output without any disarranged near field pattern even at the time when the semiconductor laser device is mounted on an actual system. According to the fabrication method described above, the semiconductor laser device having such a characteristic can be obtained with a good reproducibility.

Figure 7A:
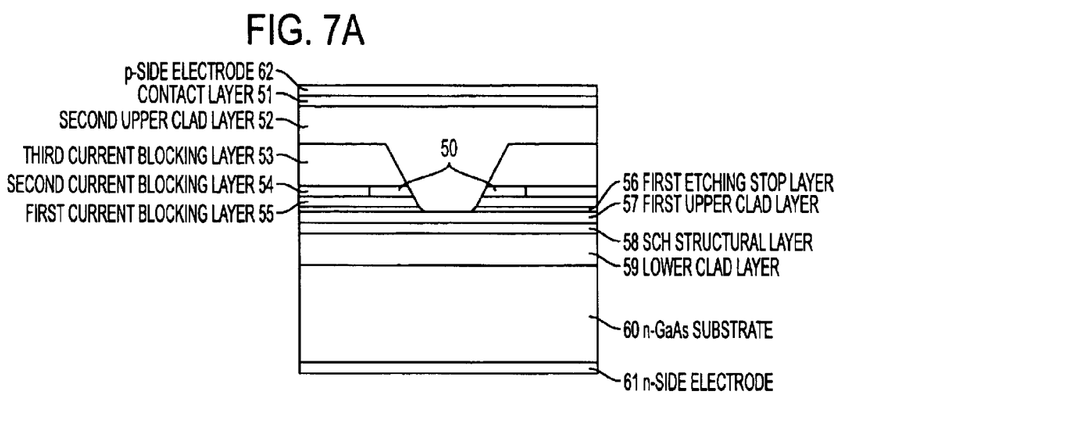
FIGS. 7A and 7B are a schematic sectional view showing a semiconductor laser according to a second embodiment and an equivalent refractive index distribution thereof.
Figure 7B:
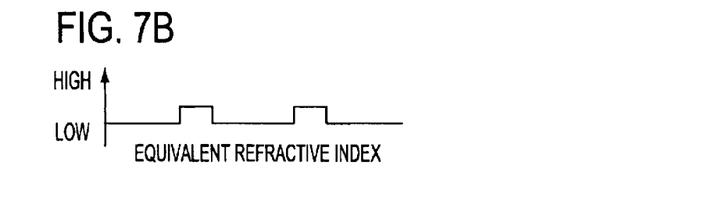

Next, a second embodiment of the present invention will be described. FIG. 7A shows a shape of a section of a semiconductor laser according to the second embodiment of the present invention, which is perpendicular to the waveguide direction, and FIG. 7B shows an equivalent refractive index distribution thereof. FIGS. 8 to 12 show steps for fabricating the semiconductor laser in order.

In the semiconductor laser as shown in FIG. 7A, on an n-GaAs substrate 60, there are formed a lower clad layer 59 made of n-InGaP, a SCH structural layer 58 made of InGaAsP, which includes an InGaAs quantum well activation layer, a first upper clad layer 57 made of p-InGaP, a first etching stop layer 56 made of n-GaAs, a first current blocking layer 55 made of n-AlGaAs, a second current blocking layer 54 made of n-InGaAsP, a third current blocking layer 53 made of n-AlGaAs, a guide layer 50 made of n-GaAs, a second upper clad layer 52 made of p-InGaP, and a contact layer 51 made of p-GaAs. An n-side electrode 61 is formed on the rear surface of the n-GaAs substrate 60, and a p-side electrode 62 is formed over the contact layer 51.

Here, semiconductors constituting the first current blocking layer 55, the second current blocking layer 54 and the third current blocking layer 53 respectively have a composition having a refractive index lower than that of GaAs. In this structure of the semiconductor laser, the GaAs guide layer 50 having a high refractive index determines a refractive index distribution in a horizontal direction, that is, a direction in parallel with the SCH structural layer 58. Accordingly, this structure of the semiconductor laser has an equivalent refractive index distribution shown in FIG. 7B when viewed in the horizontal direction, and it is understood that this structure thereof is identical to a waveguide structure of the foregoing S-ARROW structure.

Figure 8:
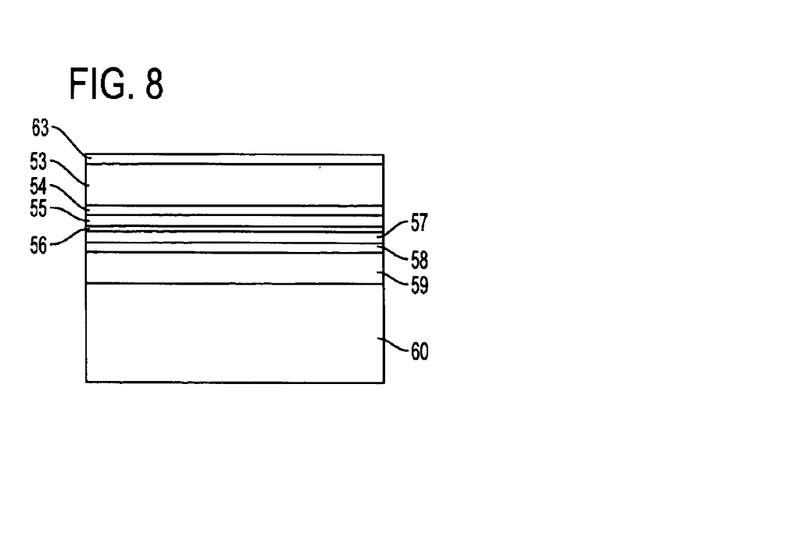
FIG. 8 is a drawing showing a manufacturing step of the semiconductor laser of FIGS. 7A and 7B.

Next, a method of fabricating the semiconductor laser will be described with reference to FIGS. 8 to 12. As shown in FIG. 8, by use of an organometallic growth method, on the n-GaAs substrate 60, there are sequentially formed the lower clad layer 59 made of n-InGaP, the SCH structural layer 58 made of InGaAsP including the InGaAs quantum well activation layer, the first upper clad layer 57 made of p-InGaP, the first etching stop layer 56 made of n-GaAs, the first current blocking layer 55 made of n-AlGaAs, the second current blocking layer 54 made of n-InGaAsP, the third current blocking layer 53 made of n-AlGaAs, and the protection layer 63 made of GaAs.

Figure 9:
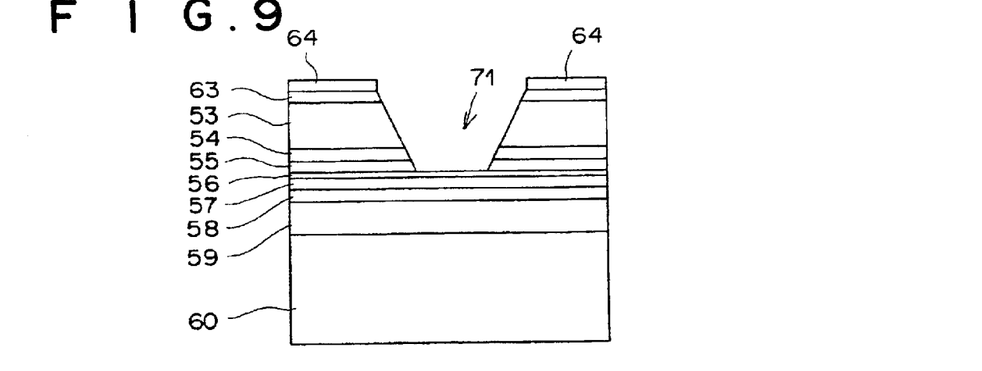
FIG. 9 is a drawing showing a manufacturing step of the semiconductor laser of FIGS. 7A and 7B.

Subsequently, as shown in FIG. 9, a resist pattern 64 is formed on parts of the cover layer 14 other than a groove portion by a photolithography step. Furthermore, the protection layer 63, the third current blocking layer 53, the second current blocking layer 54 and the first current blocking layer 55 are etched and removed by a chemical etching method. Thus, a first groove 71 extending to a direction intersecting the surface of the substrate 60 is formed.

Figure 10:
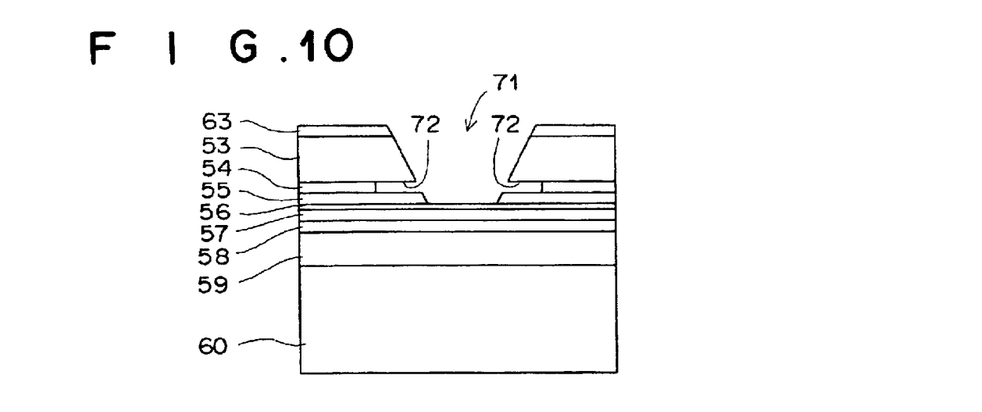
FIG. 10 is a drawing showing a manufacturing step of the semiconductor laser of FIGS. 7A and 7B.

Next, the multi-layered semiconductor film is dipped in an etching solution of tartaric acid series offering a fast etching rate only for InGaAsP, and the second current blocking layer 54 is etched to predetermined positions from the first groove 71 toward both left and right directions. Furthermore, the resist pattern 64 is also removed. Thus, the sectional structure as shown in FIG. 10 is obtained. Here, a groove extending toward a direction in parallel with the SCH structure layer 58, the groove being obtained by removing the second current blocking layer 54 in the above-described manner, shall be referred to as a second groove 72.

Figure 11:
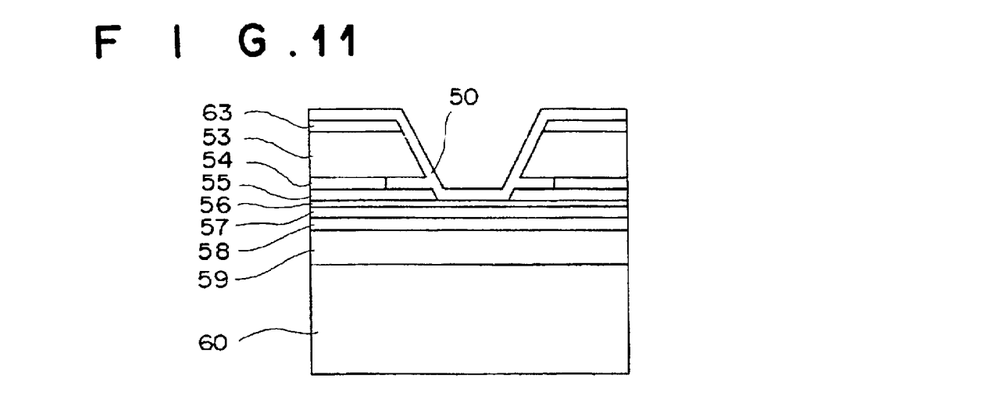
FIG. 11 is a drawing showing a manufacturing step of the semiconductor laser of FIGS. 7A and 7B.
Figure 12:
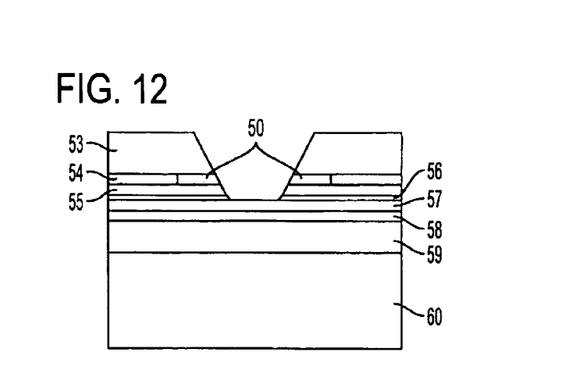
FIG. 12 is a drawing showing a manufacturing step of the semiconductor laser of FIGS. 7A and 7B.

Furthermore, as shown in FIG. 11, the guide layer 50 made of GaAs is formed by use of a vapor deposition method. At this time, since growth material gas easily enters also into the narrow second groove 72 with use of the vapor deposition method, the second groove 72 can be filled up with the guide layer 50.

Next, the multi-layered semiconductor film formed in the above-described manner is dipped in an etching solution (a mixture of ammonia and hydrogen peroxide liquid) having a property which dissolves GaAs. Since the properties of this etching solution are that it never dissolves InGaAsP and offers a remarkably lowered dissolving rate for the guide layer 50, that is a GaAs thin layer sandwiched by InGaAsP, the structure shown in FIG. 12 can be obtained.

Thereafter, the second upper clad layer 52 made of p-InGaP and the contact layer 51 made of p-GaAs are formed by a vapor deposition method, and the p-side electrode 62 is formed over the contact layer 51. The substrate 60 is polished, and then the n-side electrode 61 is formed. Furthermore, a high-reflectance coat and a low-reflectance coat are formed on a resonator plane obtained by cleaving a sample. Thereafter, when the resultant structure is processed to a chip, the semiconductor laser device shown in FIG. 7 is obtained.

In this embodiment, since the second grooves 72 are formed by etching the portions of the second current blocking layer 54 extending from the first groove 71 to predetermined positions toward left and right directions thereof, the right and left second grooves 72 extend to the positions distant from the first groove 71 by equal distances. Accordingly, the widths of the portions of the guide layers 50 filled in the right and left second grooves 72 are equal to each other with a high precision in a self-alignment manner. Thus, the semiconductor laser having the S-ARROW structure emits light in the basic lateral mode stably, and can keep a threshold value of oscillation current in the basic lateral mode low.

Also the semiconductor laser device having the above-described constitution oscillates with a resonator length of 1.5 mm and an oscillation wavelength of 980 nm, and operates up to an output of 0.5 W on a light output vs. current characteristic without any trouble. Furthermore, the semiconductor laser device can obtain a stable light output without any disarranged near field pattern even when the semiconductor laser device is mounted on an actual system. According to the fabrication method described above, the semiconductor laser device having such a characteristic can be obtained with a good reproducibility.

Figure 13A:
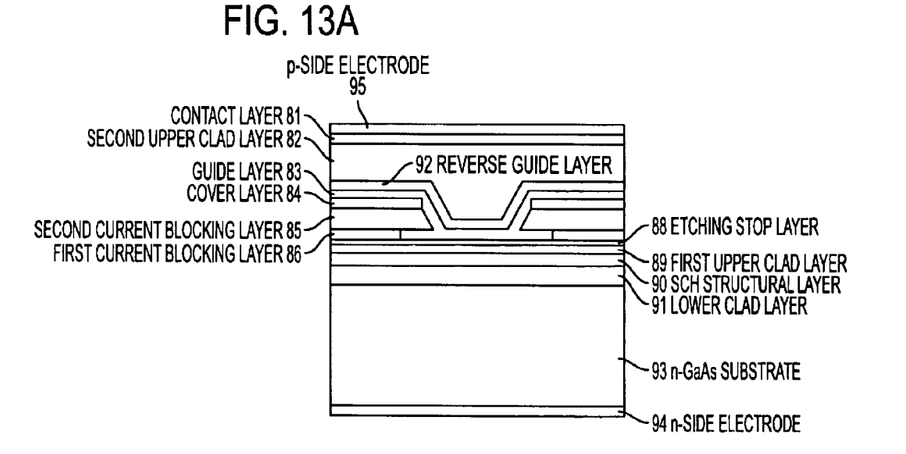
FIGS. 13A and 13B are schematic sectional views showing a semiconductor laser according to a third embodiment and an equivalent refractive index distribution thereof.
Figure 13B:
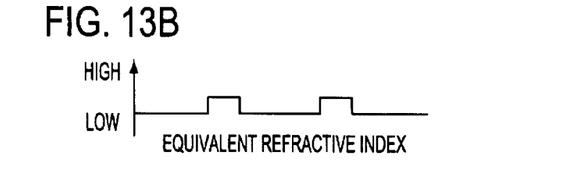

Next, a third embodiment of the present invention will be described. FIG. 13A shows a shape of a section of a semiconductor laser according to the third embodiment of the present invention, which is perpendicular to the waveguide direction, and FIG. 13B shows an equivalent refractive index distribution thereof. FIGS. 14 to 16 and FIG. 17A and 17B show steps for fabricating the semiconductor laser in order.

In the semiconductor laser as shown in FIG. 13A, on an n-GaAs substrate 93, there are formed a lower clad layer 91 made of n-InGaP, a SCH structural layer 90 made of InGaAsP, which includes an InGaAs quantum well activation layer, a first upper clad layer 89 made of p-InGaP, an etching stop layer 88 made of p-GaAs, a first current blocking layer 86 made of n-InGaAsP, a second current blocking layer 85 made of n-AlGaAs, a cover layer 84 made of n-GaAs, a guide layer 83 made of p-GaAs, a reverse guide layer 92 made of p-AlGaAs, a second upper clad layer 82 made of p-AlGaAs, and a contact layer 81 made of p-GaAs. An n-side electrode 94 is formed on the rear surface of the n-GaAs substrate 93, and a p-side electrode 95 is formed over the contact layer 81.

Here, a semiconductor constituting the current blocking layer 86 has a composition having a refractive index lower than that of GaAs. A semiconductor constituting a reverse guide layer 92 made of p-AlGaAs has a composition having a refractive index lower than the current blocking layer 85 made of n-AlGaAs.

Therefore, in this structure of the semiconductor laser, a portion having a low refractive index shown by dotted lines 101 in FIG. 17 and a portion having a high refractive index shown by slanted lines 102 in FIG. 17 determine a refractive index distribution in the horizontal direction, that is, a direction in parallel with the SCH structural layer 90. Since the semiconductors having the high and low refractive index overlap in the central portion of the groove, the refractive indexes are cancelled, while only a portion having a high refractive index exists in the scooped portion D. Accordingly, this structure of the semiconductor laser has an equivalent refractive index distribution shown in FIG. 13B when viewed in the horizontal direction, and it is understood that this structure thereof is identical to a waveguide structure of the foregoing S-ARROW structure.

Next, a method of fabricating the semiconductor laser will be described with reference to FIG. 14 to 16 and FIGS. 17A and 17B.

Figure 14:
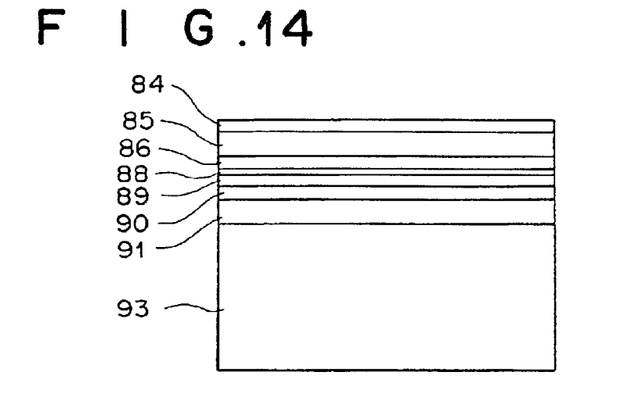
FIG. 14 is a drawing showing a manufacturing step of the semiconductor laser of FIGS. 13A and 13B.

As shown in FIG. 14, by use of an organometallic growth method, on the n-GaAs substrate 93, there are sequentially grown the lower clad layer 91 made of n-InGaP, the SCH structural layer 90 made of InGaAsP including the InGaAs quantum well activation layer, the first upper clad layer 89 made of p-InGaP, the etching stop layer 88 made of p-GaAs, the first current blocking layer 86 made of n-InGaAsP, a second current blocking layer 85 made of n-AlGaAs, and the cover layer 84 made of n-GaAs.

Figure 15:
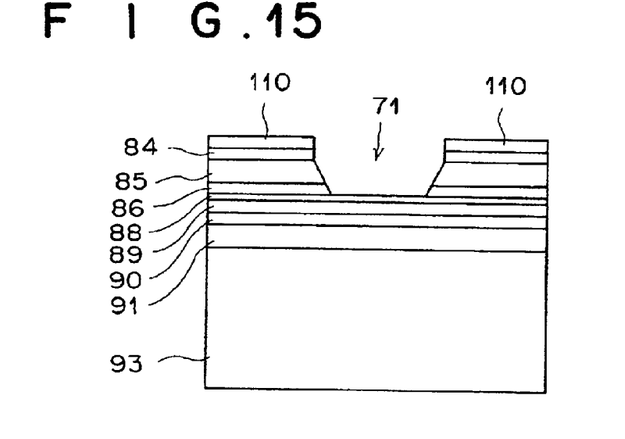
FIG. 15 is a drawing showing a manufacturing step of the semiconductor laser of FIGS. 13A and 13B.

Subsequently, as shown in FIG. 15, a resist pattern 110 is formed on the cover layer 84 other than a portion to be etched to form a groove portion using a photolithography step. Furthermore, the cover layer 84 made of n-GaAs, the second current blocking layer 85 made of n-AlGaAs and the first current blocking layer 86 made of n-InGaAsP are etched and removed by a chemical etching method. Thus, the first groove 71 extending to a direction intersecting the surface of the substrate 60 is formed.

Figure 16:
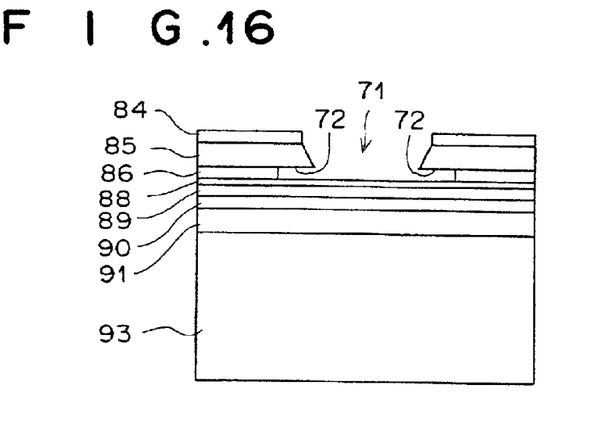
FIG. 16 is a drawing showing a manufacturing step of the semiconductor laser of FIGS. 13A and 13B.

Next, the multi-layered semiconductor film is dipped in an etching solution of tartaric acid series offering a fast etching rate only for InGaAsP, and the first current blocking layer 86 is etched to predetermined positions from the first groove 71 toward both left and right directions. Furthermore, the resist pattern 110 is also removed. Thus, the sectional structure as shown in FIG. 16 is obtained. Here, the groove extending toward a direction in parallel with the SCH structure layer 90, the groove being obtained by removing the first current blocking layer 86 in the above-described manner, shall be referred to as a second groove 72.

Figure 17A:
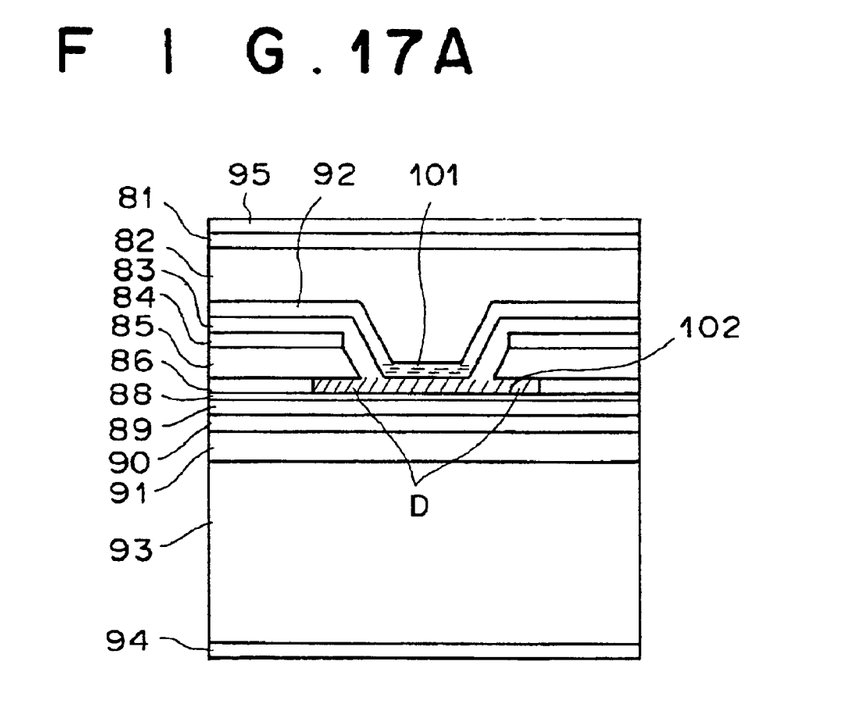
FIGS. 17A and 17B are drawings showing a manufacturing step of the semiconductor laser of FIGS. 13A and 13B.
Figure 17B:
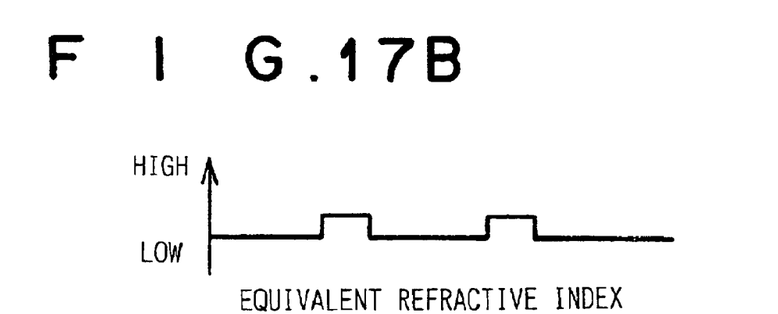

Furthermore, as shown in FIG. 17A, the guide layer 83 made of p-GaAs, the reverse guide layer 92 made of p-AlGaAs, the clad layer 82 made of p-AlGaAs and the contact layer 81 made of p-GaAs are formed by crystal growth. At this time, since growth material gas easily enters into the narrow second groove 72 by the use of a vapor deposition method, the second groove 72 can be filled up with the guide layer 83.

Thereafter, the p-side electrode 95 is formed over the contact layer 81. The substrate 93 is polished, and then the n-side electrode 94 is formed. Furthermore, a high-reflectance coat and a low-reflectance coat are formed on a resonator plane obtained by cleaving a sample. Thereafter, when the resultant structure is processed to a chip, the semiconductor laser device shown in FIG. 13 is obtained.

In this embodiment, since the second groove 72 is formed by etching the first current blocking layer 86 from the first groove 71 to the predetermined positions toward the right and left directions, the portions of the second groove 72 extend from the first groove 71 to the positions which are equally distant from the first groove 71. Accordingly, the widths of the portion of the guide layers 83 filled in the right and left second grooves 72 are equal to each other with a high precision in a self-alignment manner. Thus, the semiconductor laser having the S-ARROW structure emits light in the basic lateral mode stably, and can keep a threshold value of oscillation current in the basic lateral mode low.

In the embodiments described above, though the layers are grown on then type substrate, a p-type substrate maybe used in the present invention. In this case, it is suitable for the conductivity types of the layers to be reversed to those in the case where the n-type substrate is used.

The descriptions were made for the embodiment in which the GaAs-series semiconductors are used. In the present invention, the material is not limited to this, and GaN-series, InP-series semiconductors and the like may be employed.

Moreover, the etching of the semiconductor may be performed by any substance regardless of liquid and vapor, as long as the substance can selectively etch InGaAsP out of other crystals.

What is claimed is:

1. A method of fabricating a semiconductor laser having a structure in which an equivalent refractive index of two portions disposed apart from each other is higher than that of adjacent portions to these portions in a direction perpendicular to a waveguide direction as well as in parallel with an activation layer, comprising the steps of:
   forming said activation layer and a plurality of layers in parallel with said activation layer;
   forming a first groove penetrating through at least some of said plurality of layers;
   selectively etching a specified layer among at least some of said plurality of layers through which said first groove penetrates, said etching extending from both sides of the first groove to a predetermined position in said specified layer, thus forming a pair of second grooves; and
   filling up said second grooves with a material having a refractive index higher than that of said specified layer, thus forming two portions having said high equivalent refractive index.

2. A semiconductor laser, which has a structure in which an equivalent refractive index of two portions disposed apart from each other is higher than that of adjacent portions to these portions in a direction perpendicular to a waveguide direction as well as in parallel with an activation layer, comprising:
   said activation layer and a plurality of layers in parallel with said activation layer,
   wherein a first groove is formed penetrating through at least some of said plurality of layers;
   a pair of second grooves, extending from said first groove to predetermined positions from both sides of said first groove, are formed in a specified layer among said plurality of layers through which said first groove penetrates;
   the second grooves are filled up with a material having a refractive index higher than that of the specified layer, and thus two portions having said high equivalent refractive index are formed; and
   another layer is formed so as to contact with the material having said high refractive index remaining on a surface portion of the first groove.

3. A semiconductor laser, which has a structure in which an equivalent refractive index of two portions disposed apart from each other is higher than that of adjacent portions to these portions in a direction perpendicular to a waveguide direction as well as in parallel with an activation layer, comprising:
   said activation layer and a plurality of layers in parallel with said activation layer,
   wherein a first groove is formed penetrating through at least some of said plurality of layers;
   a pair of second grooves, extending from said first groove to predetermined positions from both sides of said first groove, are formed in a specified layer among said plurality of layers through which said first groove penetrates;
   the second grooves are filled up with a material having a refractive index higher than that of the specified layer, and thus two portions having said high equivalent refractive index are formed; and
   another layer made of a different material from that having the high refractive index is formed so as to contact with a surface portion of the first groove.

4. A semiconductor laser, which has a structure in which an equivalent refractive index of two portions disposed apart from each other is higher than that of adjacent portions to these portions in a direction perpendicular to a waveguide direction as well as in parallel with an activation layer, comprising:
   said activation layer and a plurality of layers in parallel with said activation layer,
   wherein a first groove is formed penetrating through at least some of said plurality of layers to a specified layer;
   a pair of second grooves, extending from the first groove to predetermined positions from both sides of the first groove, are formed in a specified layer among said plurality of layers through which the first groove penetrates;
   the second grooves are filled up with a material having a refractive index higher than that of the specified layer; and
   layers made of a material having a refractive index are laminated on the material exposed in the first groove, this refractive index being lower than that of the material filled up in the second groove, and thus the two portions having said high equivalent refractive index are formed outside the material having the low refractive index.

5. The semiconductor laser according to claim 4, wherein the material having the high refractive index and the material having the low refractive index are made of one refractive index distribution material, which gradually varies a refractive index thereof in a lamination direction of both of the materials.

* * * * *